United States Patent
Chiles et al.

(10) Patent No.: US 10,916,918 B2
(45) Date of Patent: Feb. 9, 2021

(54) HETERO-STRUCTURE-BASED INTEGRATED PHOTONIC DEVICES, METHODS AND APPLICATIONS

(71) Applicant: University of Central Florida Research Foundation, Inc., Orlando, FL (US)

(72) Inventors: Jeffrey Chiles, Orlando, FL (US); Sasan Fathpour, Orlando, FL (US)

(73) Assignee: UNIVERSITY OF CENTRAL FLORIDA RESEARCH Foundation, Inc., Orlando, FL (US)

( * ) Notice: Subject to any disclaimer, the term of this patent is extended or adjusted under 35 U.S.C. 154(b) by 17 days.

(21) Appl. No.: 16/207,890

(22) Filed: Dec. 3, 2018

(65) Prior Publication Data
US 2019/0207370 A1     Jul. 4, 2019

Related U.S. Application Data

(63) Continuation-in-part of application No. PCT/US2017/035646, filed on Jun. 2, 2017.

(60) Provisional application No. 62/345,393, filed on Jun. 3, 2016.

(51) Int. Cl.
| | |
|---|---|
| *H01S 5/02* | (2006.01) |
| *H01S 5/22* | (2006.01) |
| *H01S 5/20* | (2006.01) |
| *H01S 5/042* | (2006.01) |
| *G02B 6/122* | (2006.01) |

(52) U.S. Cl.
CPC .......... *H01S 5/2045* (2013.01); *G02B 6/1225* (2013.01); *H01S 5/0215* (2013.01); *H01S 5/0422* (2013.01); *H01S 5/2031* (2013.01); *H01S 5/22* (2013.01)

(58) Field of Classification Search
CPC .... H01S 5/2045; H01S 5/0215; H01S 5/0422; H01S 5/2031; G02B 6/1225
USPC ........................................................ 438/31
See application file for complete search history.

(56) References Cited

U.S. PATENT DOCUMENTS

| | | | |
|---|---|---|---|
| 2007/0170417 A1* | 7/2007 | Bowers | ................. H01S 5/0261 257/14 |
| 2014/0264400 A1 | 9/2014 | Lipson et al. | |
| 2015/0097210 A1 | 4/2015 | Krasulick et al. | |
| 2015/0177458 A1 | 6/2015 | Bowers et al. | |
| 2015/0309254 A1 | 10/2015 | Bowers | |

* cited by examiner

*Primary Examiner* — Elias Ullah
(74) *Attorney, Agent, or Firm* — Klintworth & Rozenblat IP LLP; William Greener

(57) ABSTRACT

An integrated photonic structure and a method of fabrication includes a substrate having at least one opening disposed therein; a semiconductor stack disposed above the substrate, the semiconductor stack being, at least in part, isolated from the substrate by an opening to define a suspended semiconductor membrane; and a first doped region and a second doped region located within the suspended semiconductor membrane. The first doped region is laterally separated from the second doped region by an optically active region disposed therein that defines a waveguiding region of the integrated photonic structure.

20 Claims, 10 Drawing Sheets

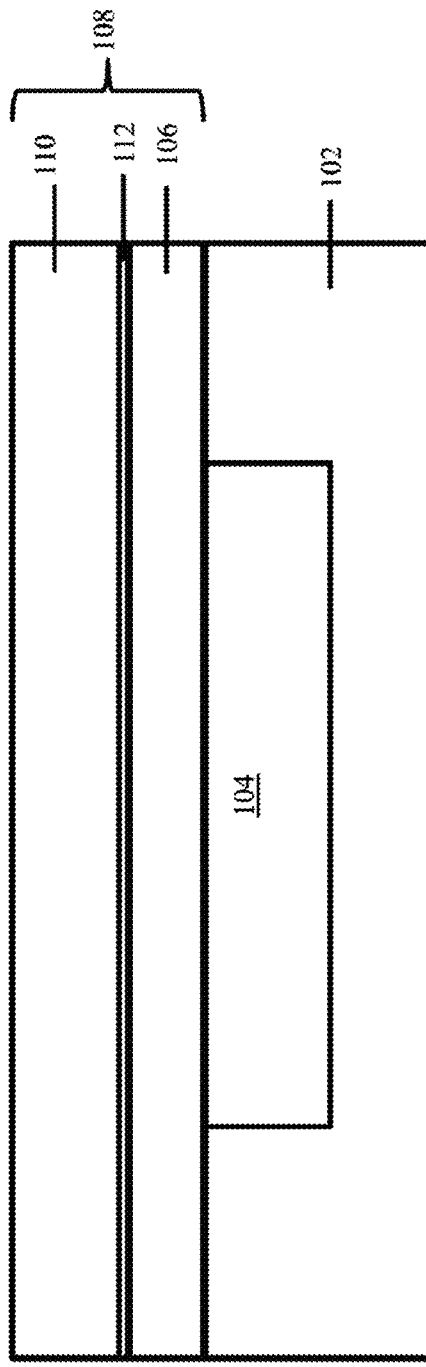
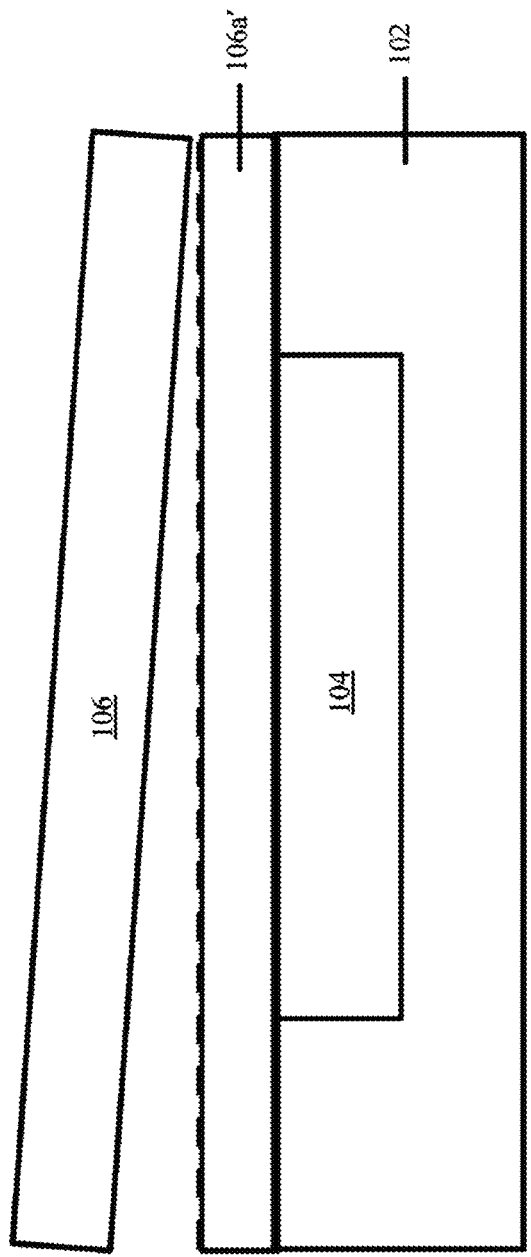

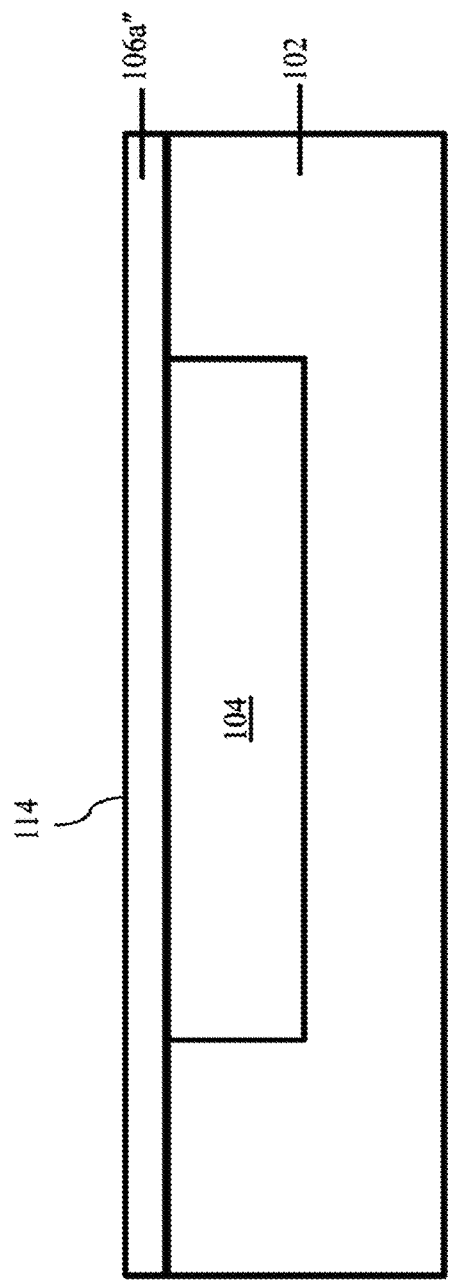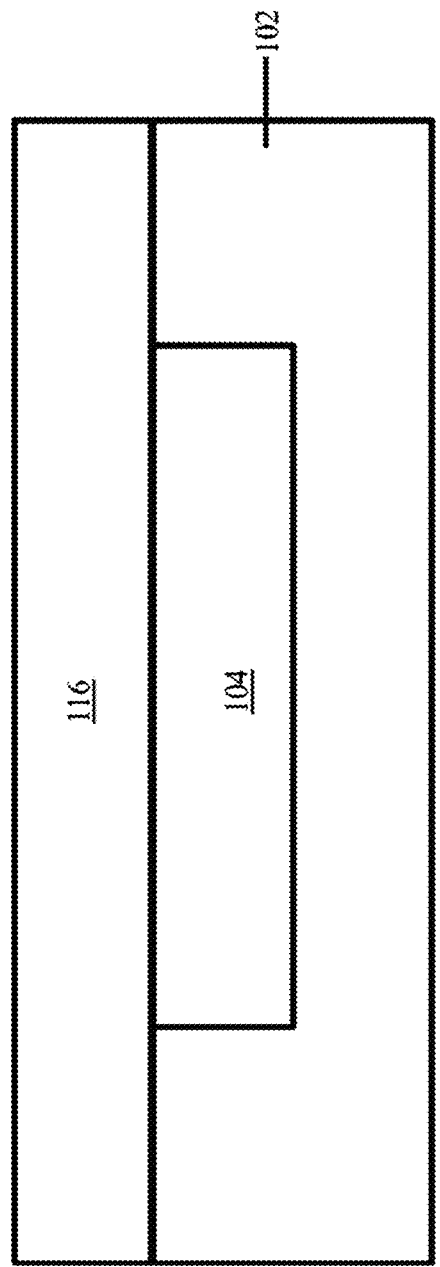

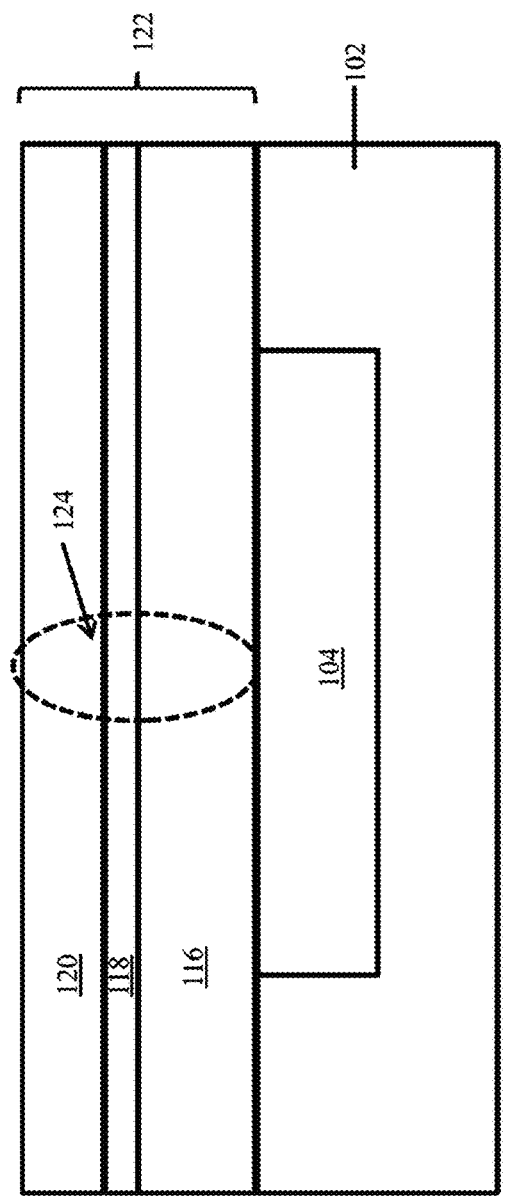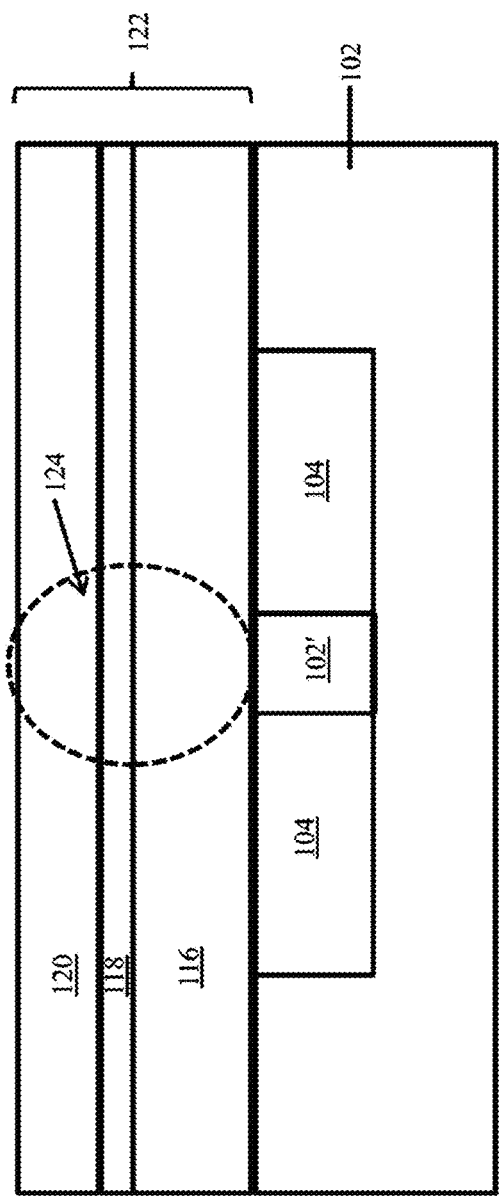

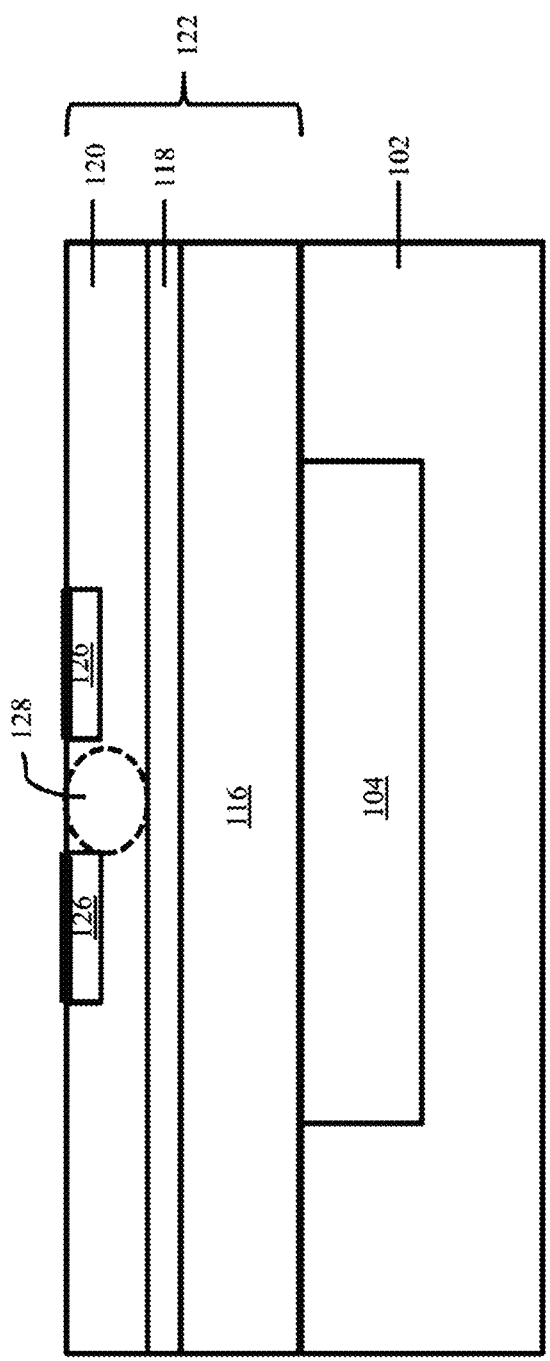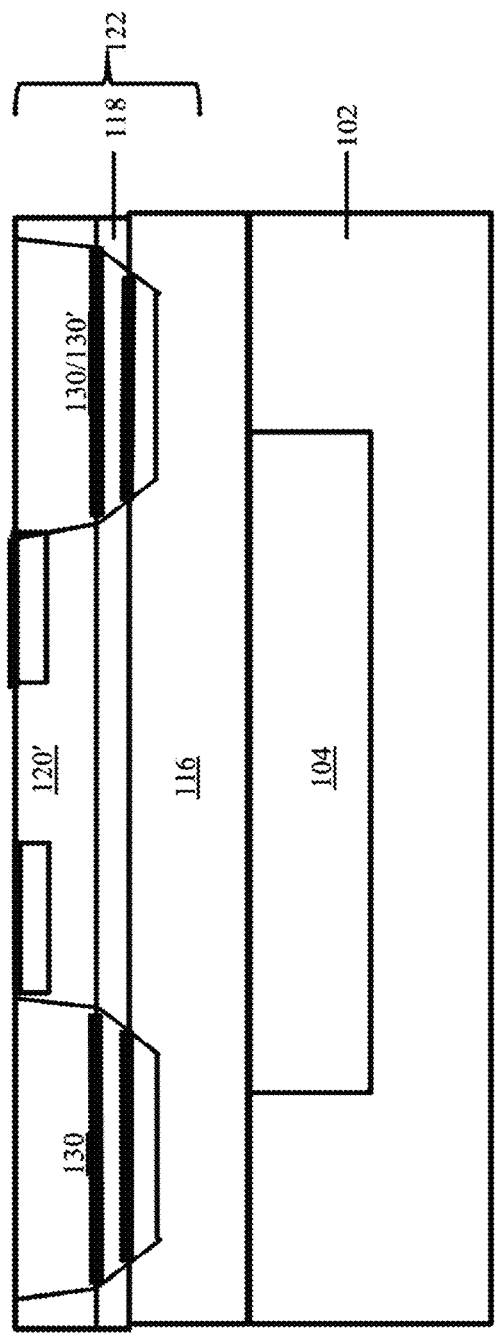

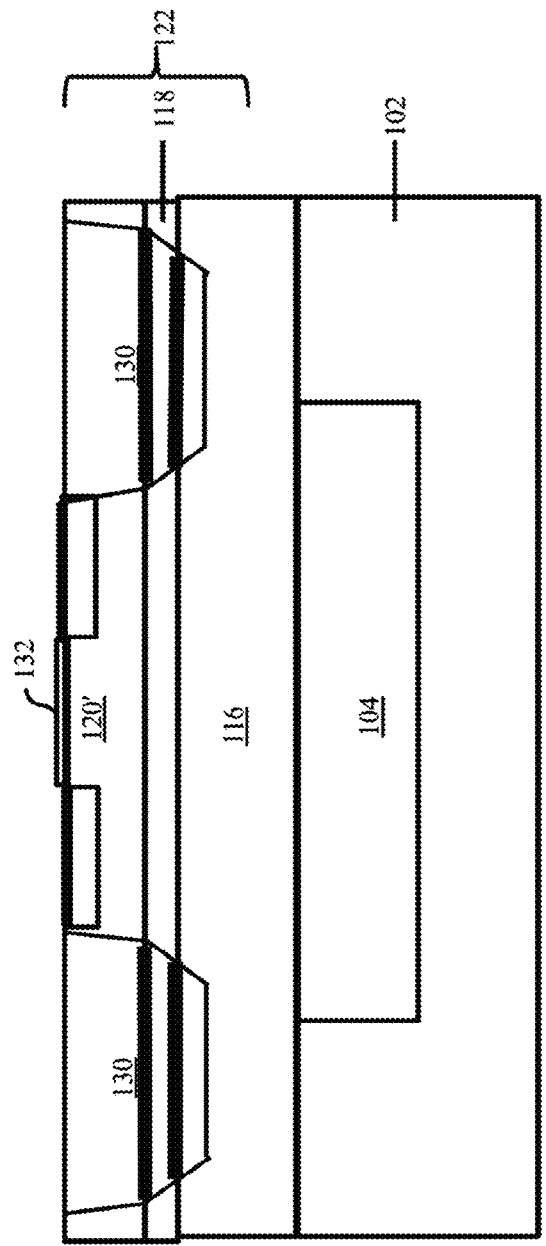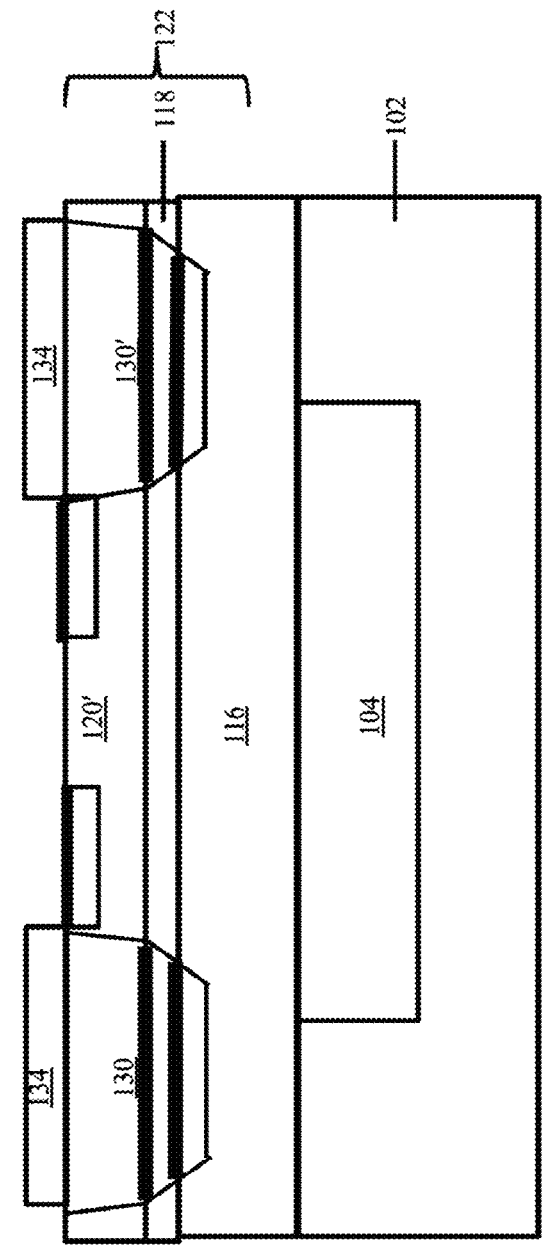

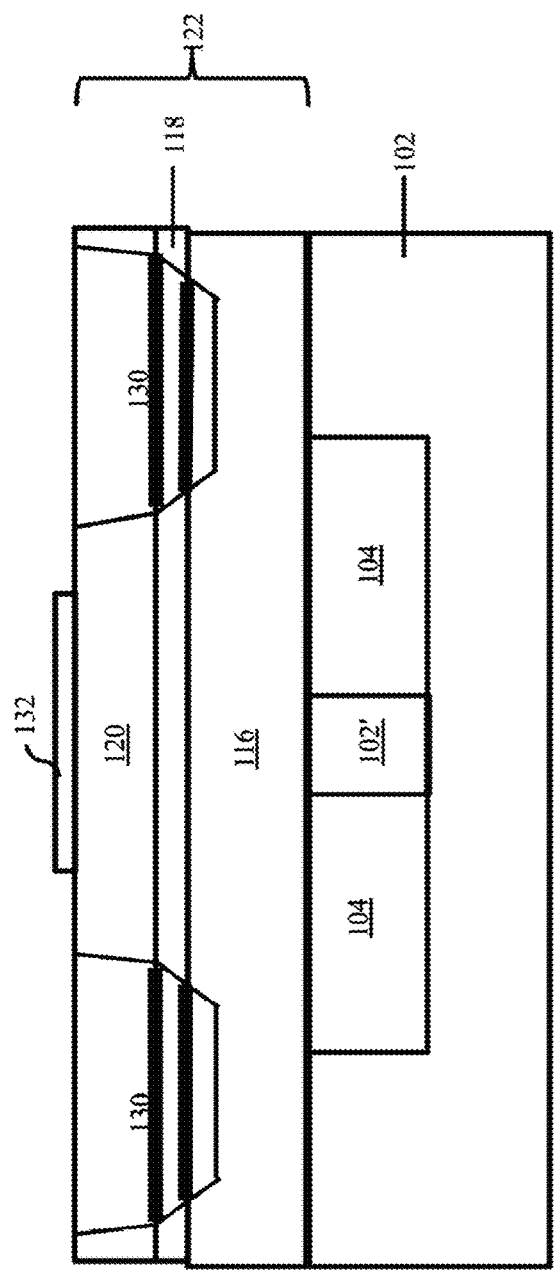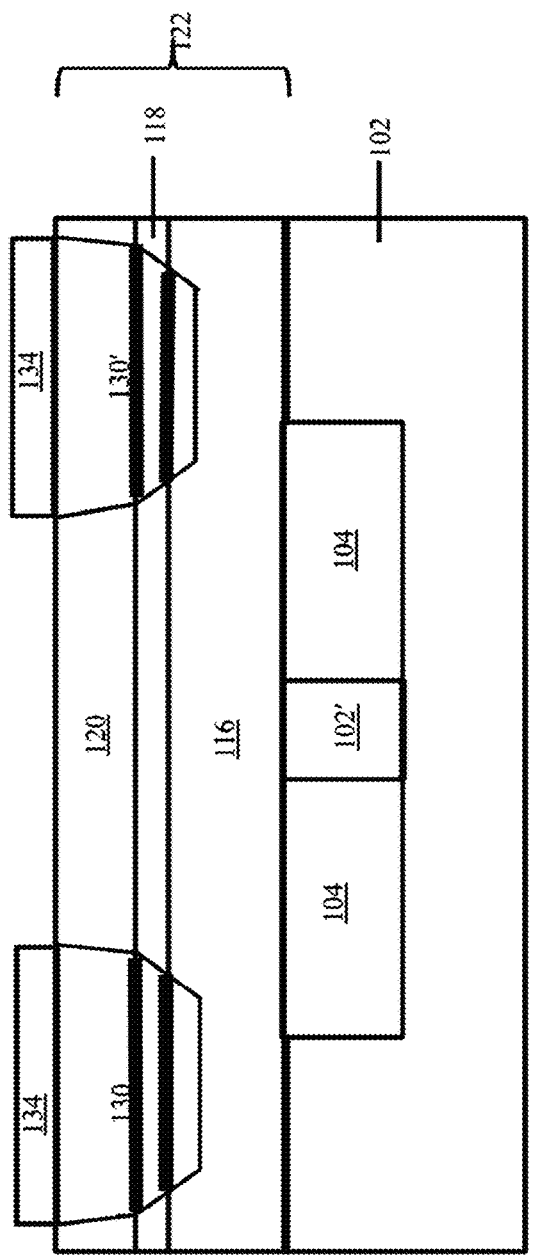

HETERO-STRUCTURE-BASED INTEGRATED PHOTONIC DEVICES, METHODS AND APPLICATIONS

CROSS-REFERENCE TO RELATED APPLICATION

This application is a continuation-in-part (CIP) application of PCT application number PCT/US2017/035646 entitled "Hetero-structure-based integrated photonic devices, methods and applications" filed Jun. 2, 2017 which derives priority from U.S. Provisional Patent Application Ser. No. 62/345,393, filed Jun. 3, 2016 entitled "Hetero-structure-based integrated photonic devices, methods, and applications," the content of which are both incorporated herein fully by reference.

STATEMENT REGARDING FEDERALLY SPONSORED RESEARCH

This invention was made with Government support under Career Award #ECCS1150672 awarded by The National Science Foundation. The government has certain rights in this invention.

FIELD

This Disclosure relates in general to the field of photonics, and more particularly, to an integrated photonic structure, and a method of fabrication thereof.

BACKGROUND

The telecommunication industry depends on reliable, high-performance and affordable integrated photonic devices, such as, for example, lasers, detectors, and modulators, to expand digital networks. Currently, most of these functions are typically performed on separate devices, which are then connected together in expensive and sensitive packaging operations. Although several advances in monolithic, integrated solutions have been accomplished, significant challenges continue to arise due in part to issues related to high material costs, fabrication complexity, as well as issues related to poor performance and reliability.

A lateral-junction-type quantum hetero-structure is known in the art, in which current is injected in a direction parallel to a multiple-quantum well, however, the fabrication processes disclosed therein does not allow fabrication of compact, integrated photonic devices. Another integrated photonic device fabrication technique known in the art which, for instance, details a common approach utilized by several conventional entities, includes a semiconductor (typically a Group III-V semiconductor) quantum hetero-structure that is bonded to a silicon waveguide structure on a silicon-on-insulator (SOI) substrate, and involves interaction between a III-V semiconductor layer and the mode of silicon waveguide to form a hybrid optical mode. Upon electrical excitation of the III-V hetero-structure, the emitted photons are carried into the silicon waveguide. However, the photonic devices obtained using this fabrication technique suffers from several issues, such as, thermal insulation, enhanced heat generation, etc., which, in turn, could lead to performance degradation of the resultant integrated photonic structure and/or device.

These and other shortcomings in the art underscore the benefits and advantages of solutions that enhance fabrication of integrated photonic structures to achieve enhanced performance and commercial advantages.

SUMMARY

This Summary is provided to introduce a brief selection of disclosed concepts in a simplified form that are further described below in the Detailed Description including the drawings provided. This Summary is not intended to limit the claimed subject matter's scope.

This Disclosure includes an integrated photonic structure that includes a substrate having at least one opening disposed therein; a semiconductor stack disposed above the substrate, the semiconductor stack being, at least in part, isolated from the substrate by the opening to define a suspended semiconductor membrane. A first doped region and a second doped region are located within the suspended semiconductor membrane, wherein the first doped region is laterally separated from the second doped region by an optically active region disposed therein that defines a waveguiding region of the integrated photonic structure. Optically active regions as used herein are non-passive device segments, where, for example, quantum well regions that cause lasing to occur, or regions where the optical intensity or phase is varied for modulation.

According to an embodiment, the waveguiding region is laterally confined equidistant from each of the first and the second doped regions within the suspended semiconductor membrane.

According to an embodiment, the first doped region includes a first dopant material, and the second doped region includes a second, different dopant material, wherein each of the first doped region and the second doped region define the optically active region to be a multiple quantum well.

According to an embodiment, each of the first and the second doped regions include same dopant material, and a gate structure disposed over the semiconductor stack, wherein each of the first doped region and the second doped region define the optically active region to be a two-dimensional electron gas channel.

According to an embodiment, the integrated photonic structure further includes an inverted T-shaped optical waveguide including a first portion that extends from a second portion, the second portion being a patterned semiconductor stack of the suspended semiconductor membrane, wherein the waveguiding region is horizontally confined at an intersection of the first portion and the second portion of the suspended semiconductor membrane.

According to an embodiment, the integrated photonic structure further includes a T-shaped optical waveguide, the T-shaped optical waveguide including a first portion that extends into the substrate, and a second portion disposed over the first portion, wherein intensity of an electric field is maximum at an intersection of the first portion and the second portion of the suspended semiconductor membrane, and the first portion comprises the substrate post.

According to an embodiment, a width "W" of the first portion is plus or minus 30% relative to a thickness "T" of the second portion.

According to an embodiment, the semiconductor stack of the suspended semiconductor membrane has a thickness of 0.2 μm to 3 μm.

According to an embodiment, the first doped region is laterally separated from the second doped region within the suspended semiconductor membrane by a distance of 1 μm to 5 μm.

In another aspect, a method for fabricating an integrated photonic structure includes providing a semiconductor stack disposed over a substrate, the semiconductor stack being, at least in part, isolated from the substrate by at least one opening disposed therein; and forming a first doped region and a second doped region within the semiconductor stack, wherein the first doped region is laterally separated from the second doped region by an optically active region disposed therein that defines a waveguiding region of the integrated photonic structure.

According to an embodiment, the waveguiding region is laterally confined equidistant from each of the first and the second doped regions within the suspended semiconductor membrane.

According to an embodiment, the first doped region includes a first dopant material, and the second doped region includes a second, different dopant material, wherein each of the first doped region and the second doped region define the waveguiding region to be a multiple quantum well.

According to an embodiment, each of the first and the second doped regions include same dopant material, and the method further includes forming a gate structure disposed over the suspended semiconductor membrane, wherein each of the first doped region and the second doped region define the waveguiding region to be a two-dimensional electron gas channel.

According to an embodiment, the method further includes patterning the suspended semiconductor membrane to define an inverted T-shaped optical waveguide, the inverted T-shaped optical waveguide including a first portion that extends from a second portion, wherein the waveguiding region is horizontally confined at an intersection of the first portion and the second portion of the suspended semiconductor membrane, and the second portion includes a patterned semiconductor stack of the suspended semiconductor membrane.

According to an embodiment, the method further includes patterning the substrate to form a substrate post that extends from the substrate, the substrate post separating each of the at least one opening, and supporting the suspended semiconductor membrane to define a T-shaped optical waveguide, wherein the T-shaped optical waveguide includes a first portion that extends into the substrate, and a second portion disposed over the first portion, the first portion including the substrate stack.

According to an embodiment, intensity of an electric field is maximum at an intersection of the first portion and the second portion of the suspended semiconductor membrane.

According to an embodiment, the providing includes patterning the substrate to form at least one opening disposed therein, prior to the providing of the semiconductor stack, and forming a seeded semiconductor layer over the substrate.

According to an embodiment, the forming the seeded semiconductor layer includes disposing a layer of the semiconductor material over the substrate, and thermally slicing the semiconductor material layer along an implanted region disposed therein, and planarizing the sliced semiconductor material layer to define the seeded semiconductor layer.

According to an embodiment, the providing includes epitaxially growing a semiconductor layer over the seeded semiconductor layer, and subsequently epitaxially growing at least one material layer over the semiconductor layer to define the semiconductor stack, the at least one material layer comprising the optically active material layer.

According to an embodiment, the forming includes implanting, at least in part, at least one dopant within the semiconductor stack to form each of the first and the second doped regions, the first doped region being laterally separated from the second doped region within the semiconductor stack by a distance of about 1 µm to about 5 µm.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following description taken in conjunction with the accompanying drawings in which:

FIG. 1A' is a cross-sectional elevational view of an alternate embodiment of the structure obtained during the fabrication of the integrated photonic structure, in accordance with one or more aspects of the present invention.

FIG. 1B' depicts an alternate embodiment of the structure of FIG. 1A, after forming an intermediate structure that, for instance, includes the semiconductor material layer, over substrate, in accordance with one or more aspects of the present invention.

FIG. 1C' depicts the structure of FIG. 1B' after chemical etching of a semiconductor substrate layer of the intermediate structure, in accordance with one or more aspects of the present invention

FIG. 1E depicts the structure of FIG. 1D after chemical mechanical polishing of the semiconductor material layer to form a seeded semiconductor layer over the substrate, in accordance to one or more aspects of the present invention.

FIG. 1F depicts the structure of FIG. 1E after epitaxial growth of the semiconductor layer over the seeded semiconductor layer, in accordance with one or more aspects of the present invention.

FIG. 1G depicts the structure of FIG. 1F subsequent to the formation of semiconductor stack over the substrate, in accordance with one or more aspects of the present invention.

FIG. 1G' is a cross-sectional elevational view of an alternate embodiment of the structure of FIG. 1A' subsequent to the formation of the semiconductor stack over the substrate, in accordance with one or more aspects of the present invention.

FIG. 1H depicts the structure of FIG. 1G subsequent to the formation of a ridge-type optical waveguide over the substrate, in accordance with one or more aspects of the present invention.

FIG. 1I depicts the structure of FIG. 1H with one or more doped region(s) being formed within the ridge-type optical waveguide, in accordance with one or more aspects of the present invention.

FIG. 1J depicts one embodiment of a resultant structure of FIG. 1I after the fabrication of an optical modulator, in accordance with one or more aspects of the present invention.

FIG. 1K depicts an alternate embodiment of a resultant structure of FIG. 1I after the fabrication of a semiconductor laser, in accordance with one or more aspects of the present invention.

FIG. 1L depicts one embodiment of a resultant structure of FIG. 1G' after the fabrication of the optical modulator, in accordance with one or more aspects of the present invention.

FIG. 1M depicts an alternate embodiment of a resultant structure of FIG. 1G' after the fabrication of the semiconductor laser, in accordance with one or more aspects of the present invention.

FIGS. 1N and 1O depict an electric field and refractive index profile, and an intensity profile of the optical mode, respectively, of the resultant structure of FIG. 1M, in accordance with one or more aspects of the present invention.

DETAILED DESCRIPTION

Reference is made below to the drawings, which are not drawn to scale for ease of understanding, wherein the same reference numbers used throughout different figures designate the same or similar components.

Disclosed herein, in part, is a structure and fabrication methods to provide a robust, high-efficiency platform on which high-quality optical devices, such as, optical modulators, lasers and detectors can be built. The embodied integrated photonic structure includes a semiconductor stack disposed over a substrate that has been isolated from the substrate either by one or more openings disposed therein or by a substrate post, to define a suspended semiconductor membrane. The suspended semiconductor membrane has an optically active layer that defines a waveguiding region, and an optical mode of the waveguiding region is confined within the center of the semiconductor stack (for instance, of the suspended semiconductor membrane). Advantageously, the suspended semiconductor membrane of the resultant integrated photonic structure and/or device facilitates overcoming several issues related to conventional integrated photonic devices, such as thermal insulation, elevated temperatures at the laser junction, bulky (i.e., tall and wide) active regions, etc.

Additionally, while the optical mode of the waveguiding region of suspended semiconductor membrane is horizontally confined within the center of the semiconductor stack, the optical mode is also vertically confined either by the openings or by the substrate post that isolate the semiconductor stack from the substrate. Such confinement of the optical mode enables enhanced heat dissipation to the substrate, thereby improving the reliability and performance of the resultant integrated photonic structure and/or device. The isolation of the suspended semiconductor membrane from the substrate also eliminates issues related to thermal insulation often observed with conventional integrated photonic devices. Still further, the location of the multiple quantum wells of the semiconductor laser disclosed herein may be chosen such that each of the multiple quantum wells coincide with the peak intensity of the optical mode. This, advantageously, allows the needed threshold current for operation of the semiconductor laser to be dramatically reduced compared to a conventional hybrid laser device. Such an overlap of the optical mode with the quantum hetero-structure also can be utilized for fabrication of other integrated photonic devices, such as, modulators with enhanced modulation speeds, and/or high-speed optical detectors.

Figure 1A:
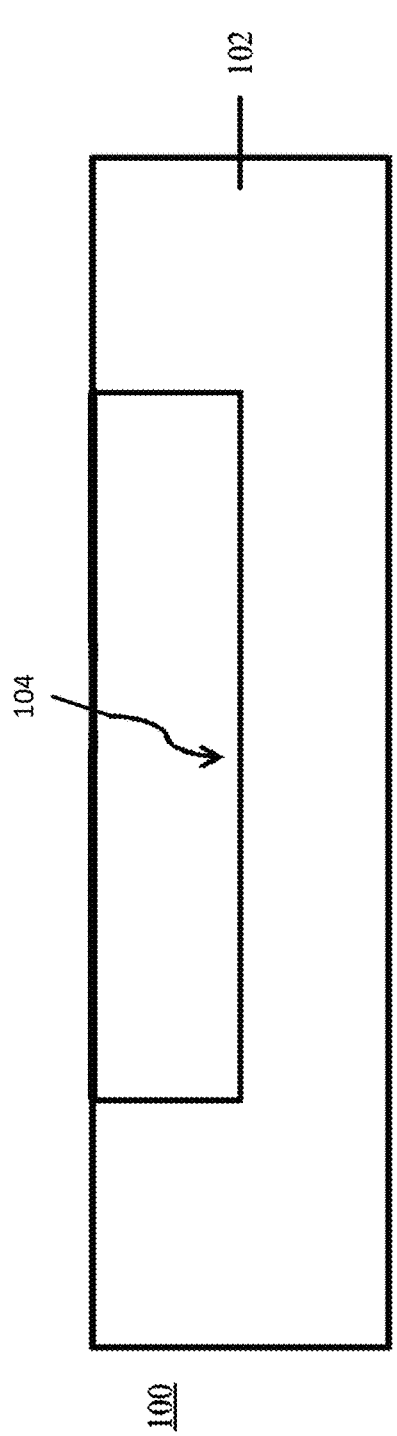
FIG. 1A is a cross-sectional elevational view of one embodiment of a structure obtained during fabrication of an integrated photonic structure, in accordance with one or more aspects of the present invention.
Figure 1A:
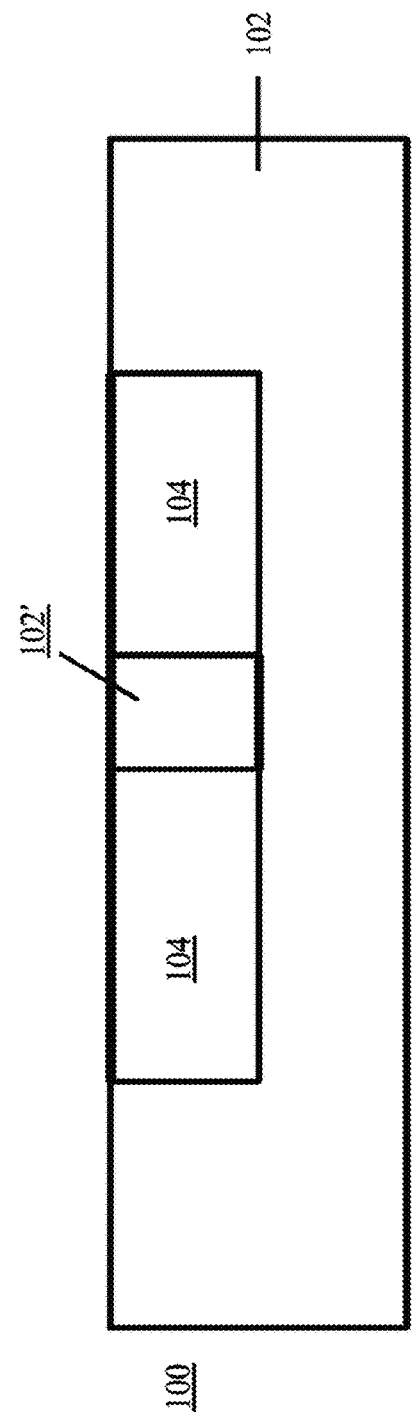

FIG. 1A depicts one embodiment of a structure 100 obtained during fabrication of an integrated photonic structure. Structure 100 includes, for instance, a substrate 102. Substrate 102 may be, for example, a bulk semiconductor material, such as a bulk silicon wafer. In another example, substrate 102 may be any silicon-containing substrate including, but not limited to, silicon (Si), single crystal silicon (Si), polycrystalline Si, or amorphous Si. As depicted in the figures, the substrate 102 may include a layered semiconductor structure, such as, silicon-on-nothing (SON), silicon-on-insulator (SOI), silicon germanium-on-insulator (SiGeOI), silicon-on replacement insulator (SRI). Substrate 102 may in addition, or instead, include various isolation structures or regions, dopant regions and/or device features. Further, substrate 102 may also include other suitable elementary semiconductors, such as, for instance, germanium (Ge), or a compound semiconductor such as, silicon germanium (SiGe), SiC, SiGeC, gallium arsenide (GaAs), gallium phosphide (GaP), gallium nitride (GaN), indium arsenide (InAs), indium phosphide (InP), and/or all other III/V or II/VI compound semiconductors.

Continuing with FIG. 1A, one or more lithographic processing steps may be employed to pattern one or more openings, i.e., opening 104 within the substrate 102. The patterning of substrate 102 may be accomplished using any of the various approaches including: direct lithography, electron beam lithography (EBL), inductively-coupled plasma reactive-ion-etching (ICP-RIE), extreme ultraviolet technique (EUV); e-beam technique; litho-etch litho-etch or litho-etch litho-freeze. Following patterning, additional etching processes, such as, anisotropic dry etching may also be performed to remove one or more portions of the substrate. The opening(s) 104 may have a width of 1 μm to 10 μm, and a depth of 0.5 μm to 5 μm. Note that, in the case of multiple openings, each of these opening(s) 104 may be separated by a portion of the substrate that defines a substrate post 102', as depicted in FIG. 1A'. The substrate post 102' may have width of 0.3 μm to 3 μm.

Figure 1B:
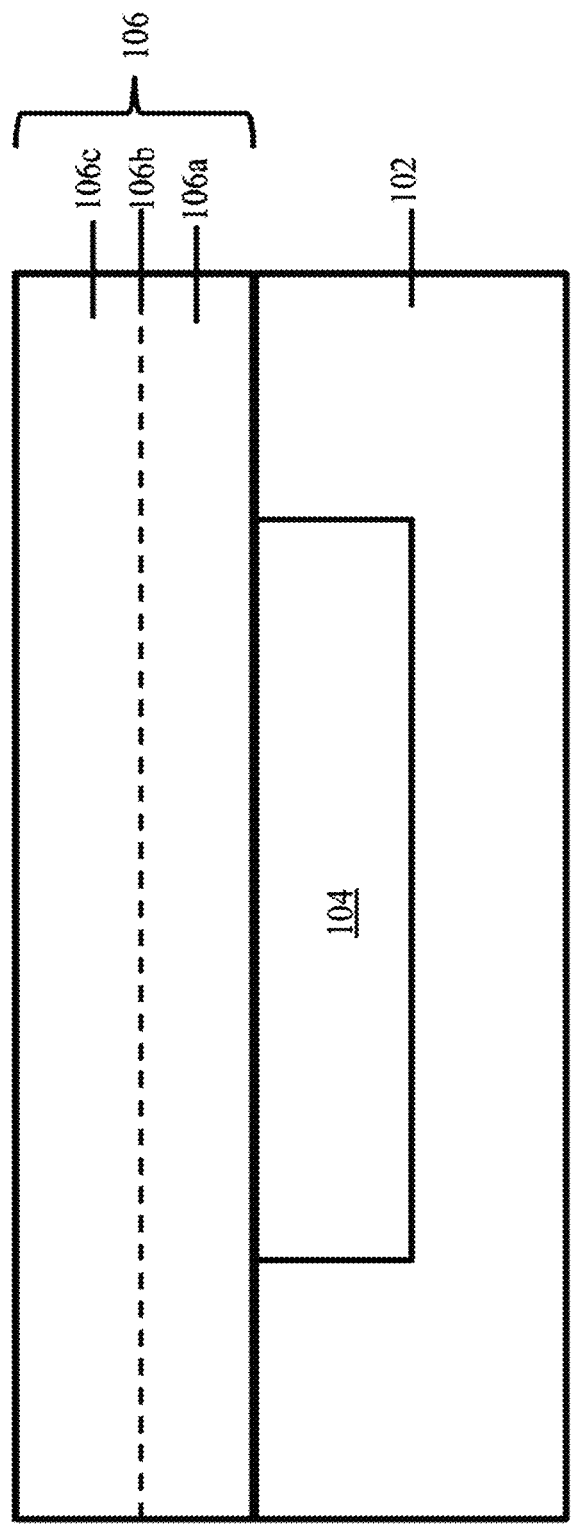
FIG. 1B depicts the structure of FIG. 1A after forming a semiconductor material layer over substrate, in accordance with one or more aspects of the present invention.

FIG. 1B depicts the structure of FIG. 1A after forming a semiconductor material layer 106 over substrate 102, for instance, via a conventional Smart-Cut technique. Semiconductor layer 106 may be, or may include, any suitable elementary semiconductors, such as, for example, silicon, germanium (Ge) in crystal, or a Group III-V compound semiconductor material, such as, for instance, silicon germanium, gallium arsenide (GaAs), indium phosphide (InP), gallium nitride (GaN), Indium arsenide (InAs), indium antimonide (InSb), and ternary or quaternary alloys of such compounds, such as, for instance, aluminum gallium arsenide, aluminum gallium indium arsenide, indium gallium phosphide, indium gallium arsenide, indium gallium arsenide phosphide, or combinations thereof. The semiconductor layer 106 may also include, or may be, a Group II-VI semiconductor material, where Group II includes elements, such as, mercury, cadmium, etc., and the Group VI includes elements such as, sulfur, selenium, tellurium, etc. The semiconductor material layer 106, in one example, may have sufficient thickness that enables further processing.

Continuing with FIG. 1B, and in one embodiment, semiconductor material layer 106 may be subjected to an ion implantation process, prior to the formation thereof, so as to create an implanted region 106b within the semiconductor material layer. Semiconductor material layer 106 may be implanted with dopants, such as, silicon (Si), beryllium (Be), boron (B), etc., which results in introducing crystal lattice defects, thereby forming implanted region 106b within semiconductor material layer 106. In one example, the dopants may be implanted within semiconductor material layer 106 at a depth of 0.5 µm to 3 µm. As understood, the crystal lattice defects at implanted region 106b allow upper portion 106c of semiconductor material layer 106 to be susceptible to thermal slicing processes, while portion 106a below implanted region 106b remains unaffected.

The ion implantation facilitates weakening a crystal lattice structure of semiconductor material layer 106 at implanted region 106b which, in turn, allows modulating a thickness of semiconductor material layer 106 to a desired thickness during subsequent fabrication processing. The depth of the implanted region 106b within semiconductor material layer 106 may be modulated by altering the process parameters, such as, implantation dose, implantation energy, etc., utilized during the ion implantation process. Although not critical to the invention, semiconductor material layer 106 may optionally be subjected to an annealing process to achieve a desired configuration and distribution of dopants within implanted region 106b. As understood, in one embodiment, semiconductor material layer 106 may be coupled to substrate 102 via appropriate surface activation processes that include, in one example, subjecting the semiconductor material layer and the substrate to one or more plasma treatment processes using argon and/or oxygen plasma.

In an additional, or an alternate embodiment, semiconductor material layer 106 may also be formed over substrate 102 by disposing an intermediate structure 108 onto which semiconductor material layer 106 has been attached, as depicted in FIG. 1B'. Intermediate structure 108 includes a semiconductor substrate layer 110, an etch stop layer 112 disposed over the semiconductor substrate layer 110, and semiconductor material layer 106 disposed over the etch stop layer 112. The semiconductor substrate layer 110 may include a material that is similar or identical to the material of the semiconductor layer 106 described above in connection with FIG. 1B. Etch stop layer 112 may be formed over semiconductor substrate layer 110 using any suitable conventional deposition processes, and may include, or may be fabricated of, a material that has sufficiently slower etch rate than the material utilized for semiconductor substrate layer 110, such that it acts as an etch-stop during subsequent etching processes. Etch stop layer 112 may be, or may include, an oxide material, such as, silicon oxide ($SiO_2$), or a nitride material, such as, silicon nitride (SiN or $Si_3N_4$), and may have a thickness of 400 to 4,000 nm. These layers of structure 108 of FIG. 1B' may be formed using a variety of different materials and fabrication techniques, such as, chemical-vapor deposition (CVD), atomic layer deposition (ALD), physical vapor deposition (PVD) or plasma-enhanced versions of such processes. The thicknesses of the depicted layers may also vary, depending on the particular application.

Continuing with FIG. 1B', and in one embodiment, intermediate structure 108 (which includes semiconductor layer 106) may be coupled to substrate 102 by subjecting exposed surfaces of each of semiconductor layer 106 and substrate 102 to a plasma treatment process using argon and/or oxygen plasma. As understood, the plasma treatment process facilitates activating the respective surfaces, and the activated surfaces may subsequently be bonded together under sufficient pressure. The resulting structure may be further annealed at a temperature between 90° C. to 300° C., depending upon the thermal budget allotted to the system.

Figure 1C:
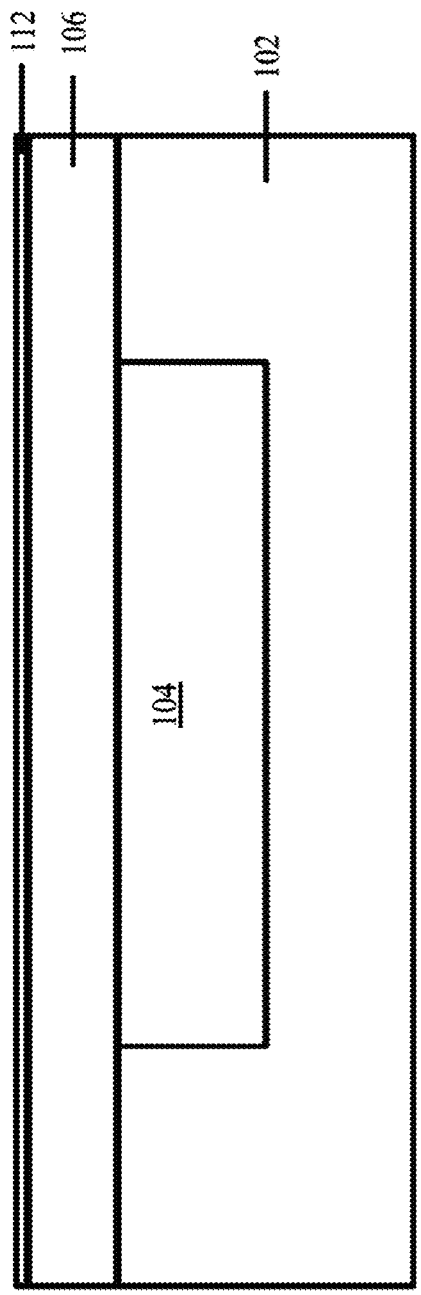
FIG. 1C depicts the structure of FIG. 1B with thermal slicing of the semiconductor material layer to reduce a thickness thereof, in accordance with one or more aspects of the present invention.
Figure 1D:
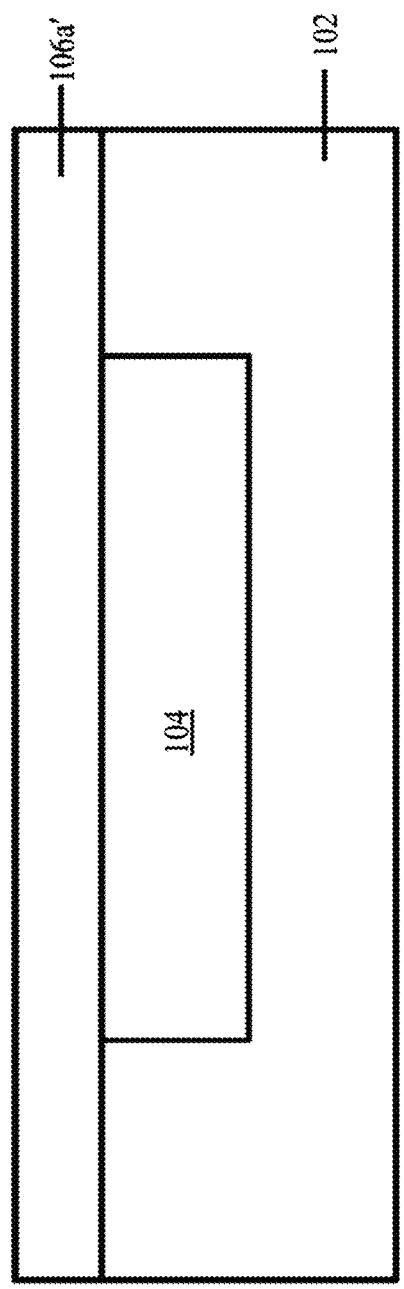
FIG. 1D depicts the structure of FIGS. 1C & 1C' subsequent to either the thermal slicing of the semiconductor material layer, or the removal of an etch-stop layer of the intermediate structure, leaving the semiconductor material layer disposed over the substrate, in accordance with one or more aspects of the present invention.

FIG. 1C depicts the structure of FIG. 1B with thermal slicing of semiconductor material layer 106 to substantially reduce a thickness thereof. The structure may be subjected to a heating device, such as, furnace, oven or the like, so as to thermally slice semiconductor material layer 106 along implanted region 106b (see FIG. 1B) which results in an semiconductor material layer (i.e., semiconductor material layer 106a') having a reduced thickness. The reduced thickness of the semiconductor material layer 106a' may be within a range of 300 nm to 5,000 nm. In a specific example, the thermal slicing process may be accomplished by exposing the structure to a temperature of 220° C. for a time period of 120 mins to 240 mins. Although not depicted in figures, one skilled in the art will understand that the thermal slicing of semiconductor material layer 106 often results in non-planar upper surface of semiconductor material layer 106a', as depicted in FIG. 1D.

In an additional, or an alternate embodiment, in case semiconductor material layer 106 is formed via intermediate structure 108, one or more suitable chemical etching processes (i.e., backside substrate removal process) may be performed to selectively remove semiconductor substrate layer 110 (FIG. 1B'), using etch stop layer 112 as an etch stop, as depicted in FIG. 1C'. Any suitable etching process, such as, isotropic wet etching or anisotropic dry etching, (e.g., reactive plasma etching) may be employed to selectively remove the semiconductor substrate layer 110 (FIG. 1B'). Etch stop layer 112 may subsequently be removed via an etch chemistry that is different from that utilized to remove the semiconductor substrate layer 110 (FIG. 1B'), leaving semiconductor material layer 106a' disposed over substrate 102, as depicted in FIG. 1D. In one example, the etch stop layer may be removed via wet or dry etch processes, such as, using Tetramethylammonium hydroxide (TMAH) as a wet etchant.

As illustrated in FIG. 1E, to reduce undesirable height variations, and thus provide a more coplanar upper surface 114, a non-selective chemical mechanical polish may be employed, resulting in a seeded semiconductor layer 106a" having a uniform thickness that is similar or identical to that of the semiconductor material layer 106a'. By way of example only, the resultant seeded semiconductor layer 106a" may have a surface roughness of less than 10 angstroms.

FIG. 1F depicts the structure of FIG. 1E after epitaxially growing semiconductor layer 116 over seeded semiconductor layer 106a" (see FIG. 1E). In one example, a selective epitaxial growth process, such as, ultra-high vacuum chemical vapor deposition (UHV-CVD), low-pressure CVD (LPCVD), reduced-pressure CVD (RPCVD), rapid thermal CVD (RTCVD), metal-organic CVD (MOCVD), or molecular beam epitaxy (MBE), processes, may be employed to form semiconductor layer 116 that includes seeded semiconductor layer 106a" (see FIG. 1E). The epitaxial growth process of semiconductor layer 116, which may have a thickness between 300 nm to 5,000 nm, may be accomplished using a material that is similar or identical to the material of the seeded semiconductor layer 106a" (see FIG. 1E). Note that, in one example, the enhanced fabrication processes described herein for the fabrication of semiconductor layer 116, and the subsequently formed semiconductor stack using the seeded semiconductor layer 106a" (see FIG. 1E) reduces undesirable fabrication costs.

As depicted in FIG. 1G, one or more additional epitaxial growth processes may be performed to provide one or more additional material layers over the semiconductor layer 116. By way of example, material layer(s) formed over semiconductor layer 116 may include an optically active material layer 118 and an additional semiconductor layer 120. In one embodiment, optically active material layer 118 defines a quantum well active layer, and may include a single quantum well layer, or of multiple quantum well layers separated by barrier layers of alternating thicknesses. Additionally, although not depicted in the figures, one skilled in the art will understand that, additional material layer(s), such as, confinement layer(s) and barrier layer(s), may also be epitaxially grown between each of the semiconductor layer 116, optically active material layer 118 and additional semiconductor layer 120. Together semiconductor layer 116, and each of the various material layer(s), defines one example of a semiconductor stack 122.

Further, as depicted, semiconductor stack 122 is isolated from the substrate 102 by opening(s) 104, thereby defining a suspended semiconductor membrane which can be utilized as an optical waveguide layer for use with fabrication of efficient, high-speed integrated photonic structures and/or devices, such as, low-noise semiconductor lasers, high-speed detectors, modulators, etc., as discussed further below. As noted, the isolation of suspended semiconductor membrane from the substrate 102, advantageously, facilitates confining optical mode of the optical waveguide layer at a waveguiding region 124 within the center of semiconductor stack 122 (i.e., of the suspended semiconductor membrane). For example, the optical mode of the suspended semiconductor membrane is horizontally confined within the waveguiding region 124 located at the center of the semiconductor stack 122, and vertically confined either by the openings or by the substrate post (see FIG. 1G') that isolate the semiconductor stack from the substrate 102.

Each of these various material layers of semiconductor stack 122 may include, or may be fabricated of, substantially similar semiconductor material(s) by simply varying their elemental compositions. For example, each of the material layers may include, or may be fabricated of a semiconductor material, such as, a Group III-V compound semiconductor material, such as, silicon germanium, gallium arsenide (GaAs), indium phosphide (InP), gallium nitride (GaN), Indium arsenide (InAs), indium antimonide (InSb), and ternary or quaternary alloys of such compounds, such as, aluminum gallium arsenide, aluminum gallium indium arsenide, indium gallium phosphide, indium gallium arsenide, indium gallium arsenide phosphide, or combinations thereof. Although the thickness of the semiconductor stack 122 may vary, depending on the particular application, in one example, the thickness of semiconductor stack 122 may be between 0.2 µm to 3 µm, with each of the various layers having thicknesses as follows: the semiconductor layer 116 may have a thickness between 100 nm to 3,000 nm, the optically active material layer 118 may have a thickness between 50 nm to 500 nm, and the additional semiconductor layer 120 may have a thickness between 100 nm to 3,000 nm, respectively. In another example, the thickness of the semiconductor stack 122 may be between 0.25 µm to 5.5 µm.

In one specific example, as depicted in Table 1 shown below, the semiconductor stack 122 of FIG. 1G may include a semiconductor layer 116 (e.g., indium phosphide), a confinement layer (e.g., indium gallium arsenide phosphide ($In_{0.72}Ga_{0.28}As_{0.61}P_{0.39}$)), a barrier layer (e.g., indium gallium arsenide phosphide ($In_{0.72}Ga_{0.28}As_{0.61}P_{0.39}$)), an optically active material layer 118 shown as a quantum well active layer (e.g., indium gallium arsenide ($In_{0.68}Ga_{0.32}As$)), additional confinement layer (e.g., indium gallium arsenide phosphide ($In_{0.72}Ga_{0.28}As_{0.61}P_{0.39}$)), and an additional semiconductor layer 120 (e.g., indium phosphide), respectively. As understood, in general, any III-V semiconductor compound may be used, provided certain conditions, related to carrier confinement, optical confinement and waveguiding, and lattice mismatch consideration for minimizing defect generation, are met. In particular, in any single or multiple quantum well active material layers, the optically active material layer 118 will have a lower effective bandgap than the adjoining barrier layers. Further, in one embodiment, the confinement layers disposed adjacent to the optically active material layer 118 may have greater effective bandgap than the optically active material layer, thus ensuring enhanced carrier confinement therein. Table 1 depicts an example structure of a semiconductor stack 122 specifying material compositions and respective thickness so as to achieve subsequent lasing at a desired optical wavelength of 1.55 µm.

TABLE 1

| Laser Heterostructure | Thickness (nm) |
|---|---|
| InP | 100 |
| $In_{0.72}Ga_{0.28}As_{0.61}P_{0.39}$ (separate confinement layer) | 70 |
| $In_{0.68}Ga_{0.32}As$ (Well) | 6 (x5) |
| $In_{0.72}Ga_{0.28}As_{0.61}P_{0.39}$ (Barrier) | 15 (x4) |
| $In_{0.72}Ga_{0.28}As_{0.61}P_{0.39}$ (separate confinement layer) | 70 |
| InP | 140 |

In an additional, or alternate embodiment, in the presence of substrate post 102', the semiconductor stack 122 that is supported by substrate post 102' results in a roughly T-shaped optical waveguide layer that is configured to transmit an optical mode of light, as depicted in FIG. 1G'. In such an example, the optical mode of the waveguiding region (i.e., of the T-shaped optical waveguide layer) is confined at the intersection of semiconductor stack 122 and the substrate post 102'. As depicted, and in one embodiment, the width of substrate post which, for instance, is between 0.3 µm to 3 µm, is substantially equal, being plus or minus 30% relative to a thickness of the semiconductor stack 122.

In enhanced embodiment, and as discussed below in further detail, each of the optical waveguide layers depicted in FIGS. 1G & 1G', during subsequent fabrication processing, result in defining an optical waveguide that can be utilized for use with the fabrication of various integrated photonic devices with different functions, namely, e.g., lasers, detectors, modulators. As understood, the fabrication processes may include certain treatments (such as, disordering of quantum wells, annealing, and regrowth of other epitaxial layers), formation of claddings, providing electrodes, etc. As one skilled in the art will understand, the use of this structure having the semiconductor stack for the fabrication of integrated photonic devices, such as, lasers, detectors, and/or modulators, is possible, because the suspended semiconductor membrane includes a semiconductor material that has been epitaxially grown to include an appropriate quantum hetero-structure. In one embodiment, each of these integrated photonic devices commonly utilize a lateral junction formed across the waveguiding region.

In an enhanced embodiment, one or more conventional chemical etching processes steps may be performed to selectively remove an exposed portion of additional semiconductor layer 120 (for instance, of semiconductor stack 122) to form one or more openings 126, as depicted in FIG. 1H. Any suitable etching process, such as, anisotropic dry etching (e.g., reactive ion etching) or isotropic wet etching processing, may be employed to selective remove the additional semiconductor layer to define openings 126. The etching of additional semiconductor layer 120 results in a strip of additional semiconductor layer 120 that laterally extends from a remaining portion of semiconductor stack 122 defining a ridge-type optical waveguide that is configured to transmit an optical mode of light. The ridge-type optical waveguide has an inverted T-shaped elevational cross-section having a vertical ridge portion that extends from the patterned horizontal semiconductor stack portion. Advantageously, the ridge, which has a width between 0.3 µm to 10 µm, facilitates horizontally confining the waveguiding region 128 at the intersection of the horizontal and the vertical portions of the inverted T-shaped ridge-type optical waveguide, with strong optical mode confinement away from the substrate 102. As understood, the waveguiding region 128 is vertically confined, for instance, by the air interfaces on the top and the bottom (i.e., of the opening 104) of the optical waveguide.

FIG. 1I depicts the structure of FIG. 1H with an unrecessed portion of semiconductor stack 122 being implanted with one or more dopants, for instance, to form one or more doped regions (i.e., doped regions 130) within the semiconductor stack. The dopant employed may be a p-type dopant or an n-type dopant. The p-type dopant refers to the addition of an impurity to the intrinsic semiconductor material(s) (i.e., of the various layers) of semiconductor stack 122 to create deficiencies of valence electrons. Examples of a p-type dopant may include boron, aluminum, gallium, or indium being added to the semiconductor material(s) of semiconductor stack 122. The n-type dopant refers to the addition of impurities to an intrinsic semiconductor material(s) of the various layers of semiconductor stack 122, which contribute more electrons to an intrinsic material, and may include (for instance) phosphorus, antimony or arsenic. As understood, and in one embodiment, each of the doped regions 130 may be implanted with a similar or identical dopant, as depicted in FIG. 1I. In another example, doped region 130 may also be implanted with a dopant that is different from that of the doped region 130'. For instance, while the doped region 130 may be implanted with a p-type dopant, the doped region 130' may be implanted with an n-type dopant, or vice versa.

Further, as depicted, the semiconductor stack 122 may be implanted with the dopants via an ion implantation process employing controlled process parameters, such as, implantation energy and/or implantation dose, so as to facilitate implanting the various layers, such as, additional semiconductor layer 120, and optically active material layer 118, and to extend at least partially into semiconductor layer 116 of semiconductor stack 122. As one skilled in the art will understand, the doped regions (i.e., doped regions 130 and/or 130'), advantageously, facilitate disordering the quantum wells of the optically active material layer 118, thereby defining waveguiding region that laterally separates each of the doped regions. As understood, the implantation process may also be modulated such that each of the doped region(s) (i.e., doped regions 130 and/or 130') is laterally separated by a distance of 1 µm to 5 µm. Further, in one embodiment, the waveguiding region is laterally confined equidistant from each of the doped regions (i.e., doped regions 130 and/or 130'), and is vertically confined by the air interfaces on the top and the bottom (i.e., of the opening 104) of the suspended semiconductor membrane. Although not depicted in the figures, one skilled in the art will understand that the etching process performed to define the ridge-type optical waveguide described above in connection with FIG. 1H may, for instance, alternatively, be performed after forming the doped regions. Further, in one embodiment, the doped regions disclosed herein enable current injection in a horizontal direction, i.e., laterally across the semiconductor stack 122.

FIG. 1J depicts a resultant structure of FIG. 1I, after forming a gate structure 132 over the ridge of the semiconductor stack to define a high-speed optical modulator. The operation of the device disclosed herein resembles that of a conventional modulation-doped field-effect transistor (MODFET). In one embodiment, the doped regions 130 that have been implanted with an identical dopant, such as, an n-type dopant, facilitate defining the waveguiding region (i.e., at the optically active material layer 118) to be a two-dimensional electron gas channel within the semiconductor stack 122 of the suspended semiconductor membrane. Upon applying a voltage to the gate structure 132 of semiconductor stack 122, the width of the two-dimensional electron gas channel may be modulated, through which the refractive index and the intensity of the optical mode peaking in the vicinity of the channel may be modulated, resulting in a variable attenuation to the optical mode. Note that, as described above, the optical mode of the suspended semiconductor membrane, for instance, has been confined within the waveguiding region at the intersection of the ridge portion 120' and the patterned semiconductor stack.

FIG. 1K depicts a resultant structure of FIG. 1I', after forming a contact structure 134 over each of the doped regions (i.e., doped regions 130 & 130') so as to provide desired electrical connection. The resultant structure, for instance, defines one example of a low-noise semiconductor laser. As depicted, the doped regions (i.e., doped regions 130 & 130') that have been implanted with different dopants, and away from the waveguiding region of the suspended semiconductor membrane, advantageously, allows current injection in a horizontal direction. This, for instance, facilitates disordering the quantum wells of the optically active material layer 118, thereby defining the waveguiding region to be a multiple quantum well of the semiconductor laser. As understood, the suspended semiconductor membrane depicted in FIG. 1K incorporates a laser hetero-structure, which results in emitted photons at the desired wavelength when an electrical current is injected across the contact structure(s) 134 disposed over the doped regions. Upon recombination of the electrons and holes, photons are emitted, which will result in lasing given sufficiently low round-trip losses in a cavity arrangement on the chip. Cavity reflection can be achieved by various means, such as, sidewall gratings, as-is cleaved facets or dielectric coatings deposited on the facets after the chip has been cleaved or polished.

As noted, and described above, in one embodiment, the waveguiding region is laterally confined at the center of the suspended semiconductor membrane, and also vertically confined by the opening 104 that isolates the semiconductor stack (for instance, of the suspended semiconductor membrane) from the substrate 102. Advantageously, such strong confinement of the optical mode, as well as the high degree of overlap between the intensity peak of the optical mode and of the quantum well regions, where the laser gain is obtained, for instance, enables enhanced heat dissipation to the substrate 102.

FIG. 1L depicts a resultant structure of FIG. 1G', after forming a gate structure 132 to define an optical modulator.

By way of example, the optical modulator of FIG. 1L can be fabricated from the structure depicted in FIG. 1G' using the process steps depicted in FIGS. 1I & 1J sequentially, as described above, to facilitate forming the doped regions 130, and to subsequently form the gate structure 132. As described above in connection with FIG. 1J, the doped regions 130 that have been implanted with an identical dopant, such as, an n-type dopant, facilitate defining the waveguiding region (i.e., of the optically active material layer 118) to be a two-dimensional electron gas channel.

FIG. 1M depicts an alternate structure of FIG. 1G', after forming a contact structure 134 to define a low-noise semiconductor laser. The semiconductor laser of FIG. 1M can be fabricated from the structure of FIG. 1G' using the process steps depicted in FIGS. 1I & 1K sequentially, as described above, to facilitate forming the doped regions (i.e., doped regions 130 & 130'), and to subsequently form the contact structure(s) 134 over each of the doped regions, respectively. As depicted and described above in connection with FIG. 1K, the doped regions (i.e., doped regions 130 & 130') that have been implanted with different dopants, and away from the waveguiding region of the suspended semiconductor membrane, advantageously, allows current injection in a horizontal direction. This, for instance, facilitates disordering the quantum wells of the optically active material layer 118, thereby defining the waveguiding region to be a multiple quantum well of the semiconductor laser.

Figures 1N, 10:
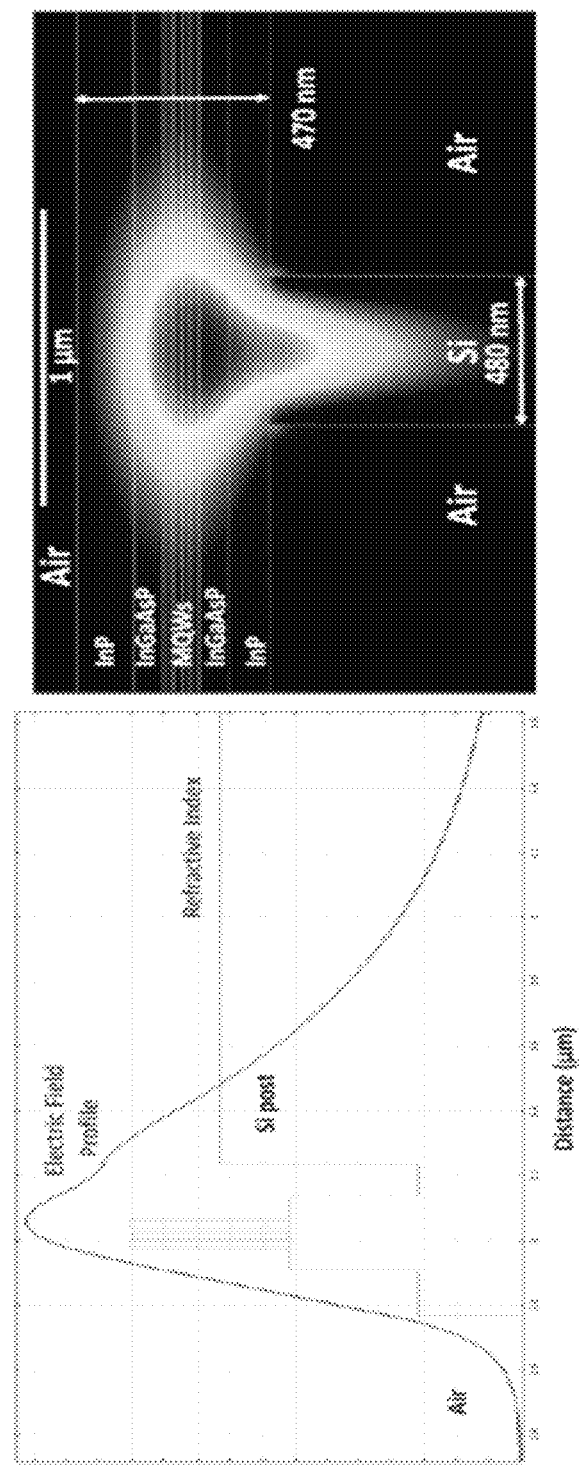

As further depicted below at FIG. 1N, the electric field profile is plotted versus the vertical distance through the waveguide structure across its middle section. It can be seen that the electric field profile is strongest in the vicinity of the quantum wells. This is further evidenced in FIG. 1O, where the cross-section of the intensity profile of the optical mode is plotted to show its localization to the junction area and its overlap with the quantum wells. Still further, in another embodiment, the location of the multiple quantum well regions of the semiconductor laser may be chosen such that it coincides with a peak intensity of the optical mode. This, advantageously, allows the needed threshold current for operation of the semiconductor laser to be dramatically reduced compared to a conventional hybrid laser device.

To summarize, therefore, the fabrication processes disclosed herein utilizing a suspended semiconductor membrane with a quantum hetero-structure bonded to a pre-patterned substrate, can be employed to fabricate a variety of high-quality optical devices. These devices include integrated lasers with excellent thermal dissipation, modulators with extremely high modulation speeds, or high-speed optical detectors. All of these devices can be fabricated by simply modifying the hetero-structure utilized in the suspended membrane portion of the device. The several advantages associated with the present invention makes it enticing for monolithic integrated photonic solutions. The semiconductor post in the middle of the disclosed structures has a much higher thermal conductivity than the state of the art made on insulating layers, such as, silicon dioxide ($SiO_2$).

The corresponding structures, materials, acts and equivalents of all means or step plus function elements in the claims below, if any, are intended to include any structure, material or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

We claim:

1. An integrated photonic structure, comprising:
   a substrate having at least one opening disposed therein;
   a semiconductor stack disposed above the substrate at least partially isolated from the substrate by the opening to define a suspended semiconductor membrane, and
   a first doped region and a second doped region located within the suspended semiconductor membrane,
   wherein the first doped region is laterally separated from the second doped region by an optically active layer disposed therein that defines a waveguiding region of the integrated photonic structure.

2. The integrated photonic structure of claim 1, wherein the waveguiding region is laterally confined equidistant from each of the first and the second doped regions within the suspended semiconductor membrane.

3. The integrated photonic structure of claim 1, wherein the first doped region comprises a first dopant material, and the second doped region comprises a second different dopant material, wherein each of the first doped region and the second doped region define the waveguiding region to be a multiple quantum well.

4. The integrated photonic structure of claim 1, wherein each of the first and the second doped regions comprise same dopant material, and a gate structure disposed over the semiconductor stack, wherein each of the first doped region and the second doped region define the waveguiding region to be a two-dimensional electron gas channel.

5. The integrated photonic structure of claim 1, further comprising an inverted T-shaped optical waveguide comprising a first portion that extends from a second portion, the second portion being a patterned semiconductor stack of the suspended semiconductor membrane, wherein the waveguiding region is horizontally confined at an intersection of the first portion and the second portion of the suspended semiconductor membrane.

6. The integrated photonic structure of claim 1, further comprising a T-shaped optical waveguide, the T-shaped optical waveguide comprising a first portion that extends into the substrate, and a second portion disposed over the first portion, wherein intensity of an electric field is maximum at an intersection of the first portion and the second portion of the suspended semiconductor membrane, and the first portion comprises a post comprising a patterned portion of the substrate.

7. The integrated photonic structure of claim 6, wherein a width "W" of the first portion is plus or minus 30% relative to a thickness "T" of the second portion.

8. The integrated photonic structure of claim 1, wherein the semiconductor stack of the suspended semiconductor membrane has a thickness between 0.2 μm to 3 μm.

9. The integrated photonic structure of claim 1, wherein the first doped region is laterally separated from the second doped region within the suspended semiconductor membrane by a distance of 1 μm to 5 μm.

10. A method for fabricating an integrated photonic structure, comprising:
   providing a semiconductor stack disposed over a substrate, the semiconductor stack being at least partially isolated from the substrate by at least one opening disposed therein to define a suspended semiconductor membrane, and forming a first doped region and a second doped region within the suspended semiconductor membrane, wherein the first doped region is laterally separated from the second doped region by an optically active region disposed therein that defines a waveguiding region of the integrated photonic structure.

11. The method of claim 10, wherein the waveguiding region is laterally confined equidistant from each of the first and the second doped regions within the suspended semiconductor membrane.

12. The method of claim 10, wherein the first doped region comprises a first dopant material, and the second doped region comprises a second, different dopant material, wherein each of the first doped region and the second doped region define the optically active region to be a multiple quantum well.

13. The method of claim 10, wherein each of the first and the second doped regions comprise same dopant material, and the method further comprises forming a gate structure disposed over the suspended semiconductor membrane, wherein each of the first doped region and the second doped region define the optically active region to be a two-dimensional electron gas channel.

14. The method of claim 10, further comprising patterning the suspended semiconductor membrane to define an inverted T-shaped optical waveguide, the inverted T-shaped optical waveguide comprising a first portion that extends from a second portion, wherein the waveguiding region is horizontally confined at an intersection of the first portion and the second portion of the suspended semiconductor membrane, and the second portion comprises a patterned semiconductor stack of the suspended semiconductor membrane.

15. The method of claim 10, wherein the at least one opening comprises a plurality of the openings, further comprising patterning the substrate to form a substrate post that extends from the substrate, the substrate post separating each of the plurality of openings, and supporting the suspended semiconductor membrane to define a T-shaped optical waveguide, wherein the T-shaped optical waveguide comprises a first portion that extends into the substrate, and a second portion disposed over the first portion.

16. The method of claim 15, wherein intensity of an electric field is maximum at an intersection of the first portion and the second portion of the suspended semiconductor membrane.

17. The method of claim 10, wherein the providing comprises patterning the substrate to form the opening disposed therein, prior to the providing of the semiconductor stack, and forming a seeded semiconductor layer over the substrate.

18. The method of claim 17, wherein the forming the seeded semiconductor layer comprises disposing a layer of a semiconductor material over the substrate, and thermally slicing the semiconductor material layer along an implanted region disposed therein, and planarizing the sliced semiconductor material layer to define the seeded semiconductor layer.

19. The method of claim 18, wherein the providing comprises epitaxially growing a semiconductor layer over the seeded semiconductor layer, and subsequently epitaxially growing at least one material layer over the semiconductor layer to define the semiconductor stack, the at least one material layer comprising an optically active material layer.

20. The method of claim 19, wherein the forming comprising ion implanting, at least in part, at least one dopant within the semiconductor stack to form each of the first and the second doped regions, the first doped region being laterally separated from the second doped region within the semiconductor stack by a distance of about 1 μm to about 5 μm.

* * * * *